United States Patent [19]

Uesugi

[11] Patent Number: 5,272,665
[45] Date of Patent: Dec. 21, 1993

[54] SEMICONDUCTOR MEMORY WITH IMPROVED SENSE AMPLIFIER LAYOUT

[75] Inventor: Masaru Uesugi, Tokyo, Japan

[73] Assignee: Oki Electric Industry Co., Ltd., Tokyo, Japan

[21] Appl. No.: 903,258

[22] Filed: Jun. 24, 1992

[30] Foreign Application Priority Data

Jun. 25, 1991 [JP] Japan .................. 3-153546

[51] Int. Cl.$^5$ .............................................. G11C 13/00
[52] U.S. Cl. ........................ 365/63; 365/189.01; 365/207; 365/208
[58] Field of Search ............ 365/189.01, 63, 51, 365/207, 208, 190

[56] References Cited

U.S. PATENT DOCUMENTS

| 4,920,517 | 4/1990 | Yamauchi et al. | 365/207 |
| 4,982,368 | 2/1991 | Arimoto | 365/207 |

FOREIGN PATENT DOCUMENTS

| 57-208691 | 6/1981 | Japan . |
| 62-73492 | 4/1987 | Japan . |
| 63-48697 | 3/1988 | Japan . |
| 63-224250 | 9/1988 | Japan . |
| 63-234494 | 9/1988 | Japan . |
| 2-183489 | 6/1990 | Japan . |
| 2-183490 | 6/1990 | Japan . |

Primary Examiner—Eugene R. LaRoche
Assistant Examiner—Vu Le
Attorney, Agent, or Firm—Edward D. Manzo

[57] ABSTRACT

A semiconductor memory has a matrix of memory cells crossed by word lines and bit lines. In each group of eight adjacent bit lines, a first sense amplifier is coupled to the first and sixth bit lines, a second sense amplifier to the third and eighth bit lines, a third sense amplifier to the second and fifth bit lines, and a fourth sense amplifier to the fourth and seventh bit lines. The first and third sense amplifiers are located side by side on one side of the memory matrix, between the second and fifth bit lines. The second and fourth sense amplifiers are located side by side on the opposite side of the memory matrix, between the fourth and seventh bit lines.

19 Claims, 5 Drawing Sheets

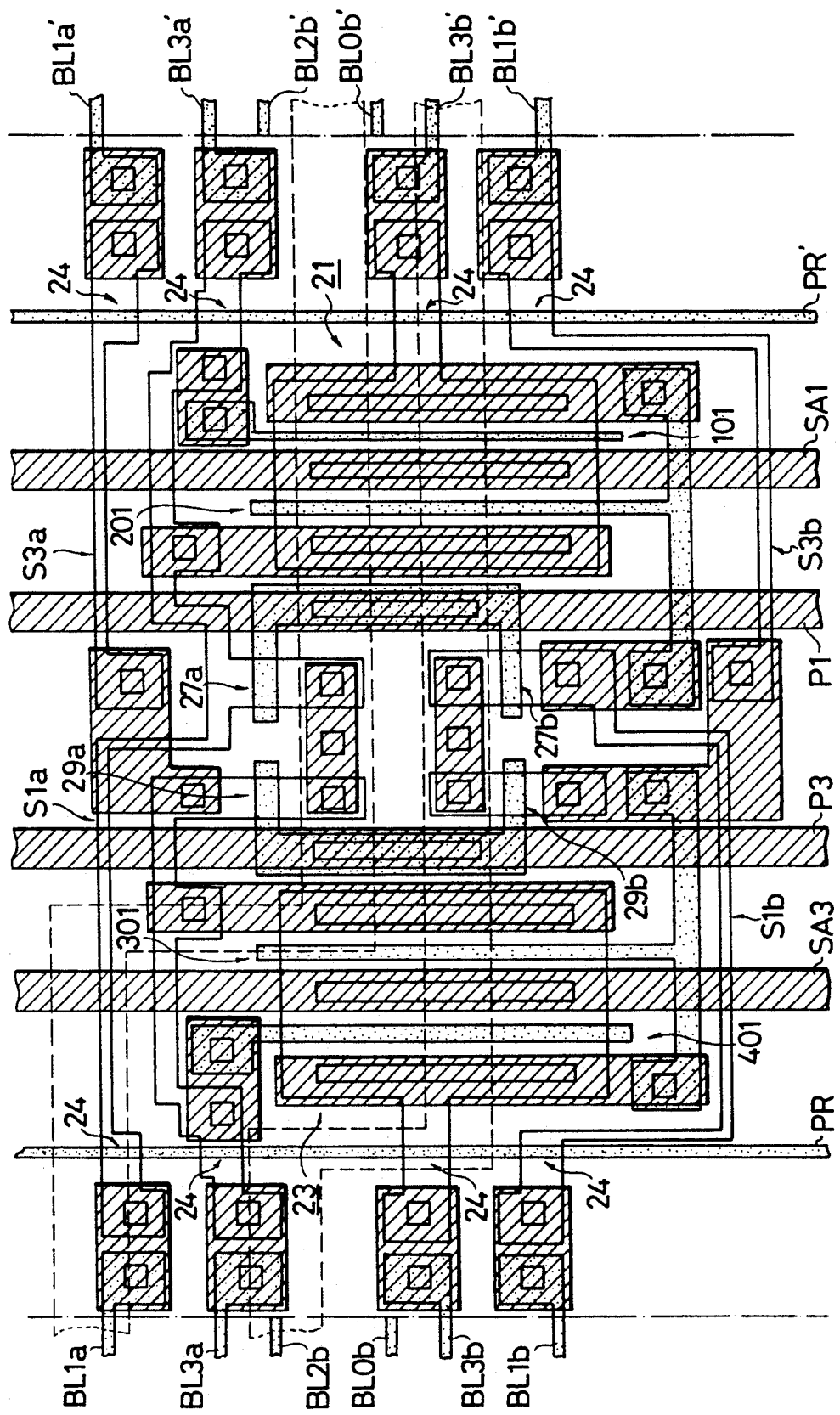

SEMICONDUCTOR MEMORY WITH IMPROVED SENSE AMPLIFIER LAYOUT

BACKGROUND OF THE INVENTION

This invention relates to a semiconductor memory such as a dynamic random access memory, more particularly to a semiconductor memory with an improved sense amplifier layout.

A semiconductor memory comprises an orthogonal matrix crossed by word lines and bit lines, with memory cells disposed at alternate intersections. The bit lines are connected pairwise to sense amplifiers.

A problem in the layout of such a memory is the large size of the sense amplifiers. The conventional solution is to dispose the sense amplifiers alternately on opposite sides of the memory cell matrix. Thus the first and second bit lines are coupled to a first sense amplifier on a first side of the matrix, the third and fourth bit lines are coupled to a second sense amplifier on the opposite side of the matrix, the fifth and sixth bit lines are coupled to a third sense amplifier disposed again on the first side of the matrix, and so on.

This arrangement provides additional room for the sense amplifiers, but it still has the problem tha the pair of bit lines to which a sense amplifier is coupled must be separated sufficiently that the sense amplifier can be disposed between them. Thus the first and second bit lines must be mutually separated by a certain large distance, as must the third and fourth bit lines, the fifth and sixth bit lines, and so on. The need for this spacing between adjacent bit lines is an obstacle to reduction of the size of the memory cell matrix.

Another problem with the conventional arrangement is that although the first and third sense amplifiers, for example, are somewhat separated, they are connected to the same pair of data bus lines. Long interconnecting lines between the sense amplifiers and data bus lines are therefore necessary, but this is also an obstacle to size reduction, and furthermore limits the operating speed of the memory.

SUMMARY OF THE INVENTION

It is accordingly an object of the present invention to achieve a more compact semiconductor memory layout.

Another object of the invention is to increase the speed of semiconductor memory devices.

The invented semiconductor memory comprises a plurality of parallel word lines, at least eight parallel bit lines orthogonally intersecting the word lines, and a memory matrix having a plurality of memory cells disposed at alternate intersections of the word lines and bit lines. A first sense amplifier is coupled to the first and sixth bit lines. A second sense amplifier is coupled to the third and eighth bit lines. A third sense amplifier is coupled to the second and fifth bit lines. A fourth sense amplifier is coupled to the fourth and seventh bit lines.

The first and third sense amplifiers are disposed on one side of the memory matrix, between the second and fifth bit lines. The second and fourth sense amplifiers are disposed on the opposite side of the memory matrix, between the fourth and seventh bit lines.

BRIEF DESCRIPTION OF THE DRAWINGS

FIGS. 3A to 3C are layout diagrams showing various layers and conductors forming the circuit of FIG. 2.

DETAILED DESCRIPTION OF THE INVENTION

Figure 1:
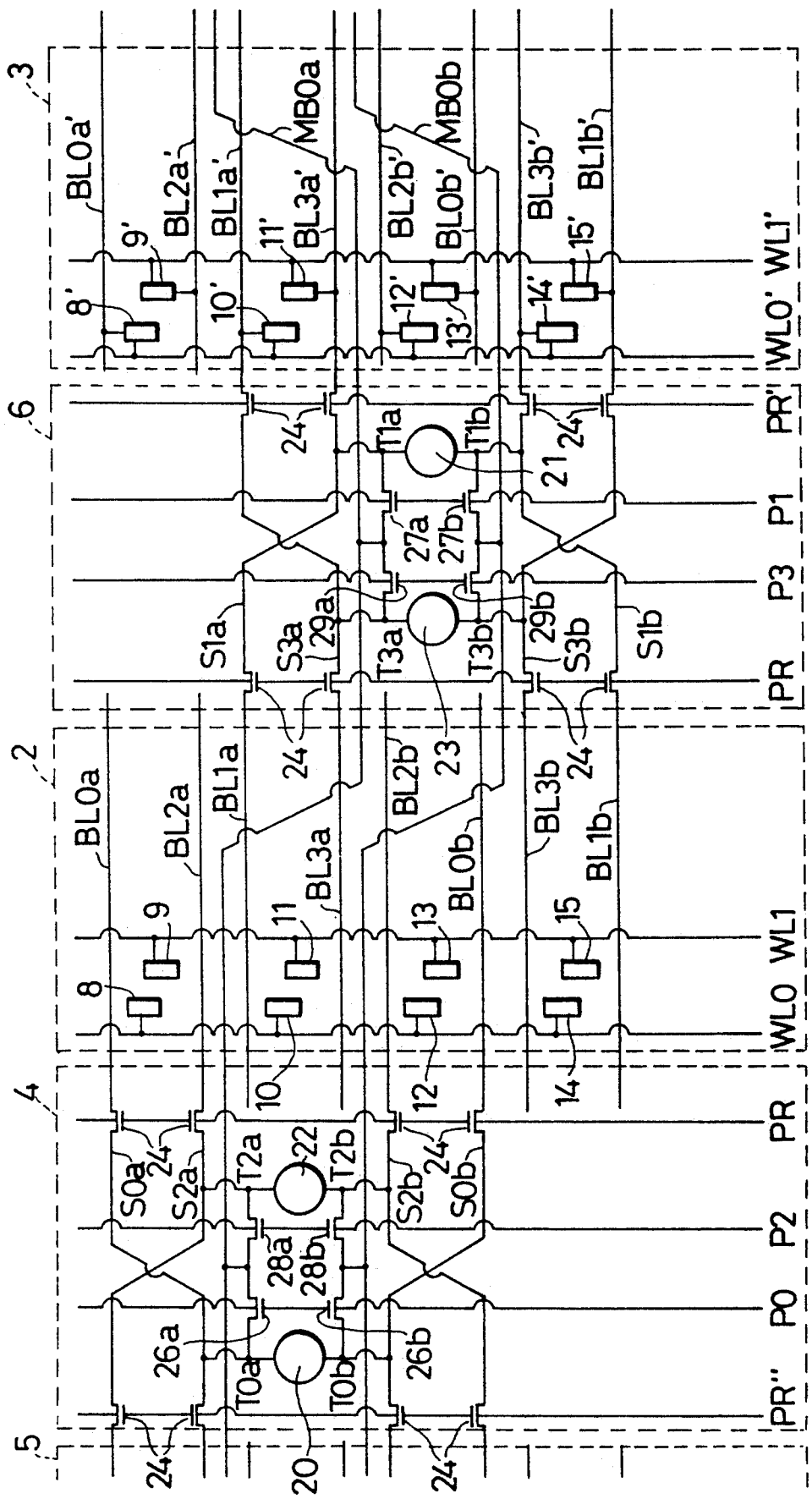
FIG. 1 is a circuit diagram of a semiconductor memory according to the invention.

A semiconductor memory embodying the present invention will be described with reference to the attached drawing. The drawing illustrates the invention but does not restrict its scope as defined in the appended claims.

Referring to FIg. 1, the invented memory comprises a memory matrix 2, a sense and data multiplexer section 4 which is disposed on the left side of the memory matrix 2 in the drawing, and a sense and data multiplexer section 6 disposed on the right side of the memory matrix 2 in the drawing. The memory also comprises an additional memory matrix 3 on the right side of the sense and data multiplexer section 6, with an additional sense and data multiplexer adjacent to its right edge. There is also an additional memory matrix 5 on the left side of the sense and data multiplexer section 4, with an additional sense and data multiplexer section adjacent to its left edge. That is, the combination of the memory matrix and the sense and data multiplexer is repeated. It can be repeated any number of times.

The memory matrix 2 is crossed by a plurality of word lines running vertically in the drawing, and a plurality of bit lines running horizontally in the drawing. The word lines are denoted WL0, WL1, ..., from left to right in the drawing. Only two word lines are shown, but there will normally be a much larger number. The bit lines are numbered as follows and arranged in order of their numbers from top to bottom in the drawing:

first bit line: BL0a
second bit line: BL2a
third bit line: BL1a
fourth bit line: BL3a
fifth bit line: BL2b
sixth bit line: BL0b
seventh bit line: BL3b
eighth bit line: BL1b Normally there will be a larger number of bit lines, but the others repeat the same pattern as the first eight.

Memory cells 8, 9, ..., 15 are coupled to the above word lines and bit lines as follows. Memory cells 8, 10, 12, and 14 are coupled to the word line WL0 and the first, third, fifth, and seventh bit lines BL0a, BL1a, BL2b, and BL3b, respectively. Memory cells 9, 11, 13, and 15 are connected to the next word line WL1 and the second, fourth, sixth, and eighth, bit lines BL2a, BL3a, BL0b, and BL1b, respectively. Each memory cell is, for example, a dynamic memory cell comprising a transistor having a gate connected to the word line and a capacitor coupled via the transistor to the bit line in a well-known arrangement.

The bit lines BL0a, BL2a, BL2b and BL0b extend into the sense and data multiplexer section 4, where they are coupled via transistor switches 24 to sense lines S0a, S2a, S2b and S0b, which in turn are connected to sense nodes T0a, T2a, T2b and T0a of sense amplifiers 20 and 22. The bit lines BL1a, BL3a, BL3b and BL1b are terminated, at their lefts ends, substantially at the left edge of the memory matrix 2.

The bit lines BL1a, BL3a, BL3b and BL1b extend into the sense and data multiplexer section 6, where they are coupled via transistors switches 24 to sense lines S1a, S3a, S3b and S1b, which in turn are connected to sense nodes T1a, T3a, T3b and T1b of sense amplifiers 21 and 23. The bit lines BL0a, BL2a, BL2b and BL0b are terminated, at their right ends, substantially at the right edge of the memory matrix 2.

Specifically, the first bit line BL0a is coupled via the sense line S0a to the sense node T2a of the first sense amplifier 20. The second bit line BL2a is coupled via the sense line S2a to the sense node T2a of the third sense amplifier 22. The third bit line BL1a is coupled via the sense line S1a to the sense node T1a of the second sense amplifier 21. The fourth bit line BL3a is coupled via the sense line S3a to the sense node T3a of the fourth sense amplifier 23. The fifth bit line BL2b is coupled via the sense line S2b to the sense node T2b of the third sense amplifier 22. The sixth bit line BL0b is coupled via the sense line S0b to the sense node T0b of the first sense amplifier 20. The seventh bit line BL3b is coupled via the sense line S3b to the sense node T3b of the fourth sense amplifier 23. The eighth bit line BL1b is coupled via the sense line S1b to the sense node T1b of the second sense amplifier 21.

The gates of the transistor switches 24 are coupled to respective precharge signal lines PR, PR' and PR''.

The sense amplifiers 20 and 22 in the sense and data multiplexer section 4 are disposed sided by side in the horizontal direction in the figure, i.e., in the direction parallel to the bit lines, or the row direction. Similarly, the sense amplifiers 21 and 23 in the sense and data multiplexer section 6 are disposed side by side in the row direction.

The second and fifth bit lines BL2a and BL2b are connected to the sense amplifier 22 positioned closer (than the sense amplifier 20) to the memory matrix 2, while the first and sixth bit lines BL0a and BL0b are connected to the sense amplifier 20 disposed farther from the memory matrix Similarly, the fourth and seventh bit lines BL3a and BL3b are connected to the sense amplifier 23 positioned closer (than the sense amplifier 21) to the memory matrix 2, while the third and eighth bit lines BL1a and BL1b are connected to the sense amplifier 21 disposed farther from the memory matrix 2.

To facilitate connection of the sense lines S0a and S2a to the sense amplifiers 20 and 22 which are disposed side by side, the sense lines S0a and S2a cross each other at a location intermediate, in the row direction, between the sense amplifiers 20 and 22. For the same reason, the sense lines S0b and S2b cross each other at a location intermediate, in the row direction, between the sense amplifiers 20 and 22. Similarly, to facilitate connection of the sense lines S1a and S3a to the sense amplifiers 21 and 23 which are disposed side by side, the sense lines S1a and S3a cross each other at a location intermediate, in the row direction, between the sense amplifiers 21 and 23. For the same reason, the sense lines S1b and S3b cross each other at a location intermediate, in the row direction, between the sense amplifiers 21 and 23.

The internal configuration of the memory matrix 3 is similar to the memory matrix 2, and the first to eighth bit lines BL0a', BL2a', BL1a', BL3a', BL2b', BL0b', BL3b' and BL1b', the word lines WL0' and WL1', and memory cells 8' to 15' are connected as illustrated.

The bit lines BL0a', BL2a', BL2b' and BL0b' are terminated, at their left ends, substantially at the left edge of the memory matrix 3. The bit lines BL1a', BL3a', BL3b' and BL1b' extend into the sense and data multiplexer section 6, where they are coupled via transistor switches 24 to the sense lines S1a, S3a, S1b and S3b, which in turn are connected to the sense nodes T1a, T3a, T3b and T1b of the sense amplifiers 21 and 23.

It will be seen that the differently numbered bit lines in the two memory matrices 2 and 3 are coupled to the common sense lines. For instance, the third bit line BL1a and the fourth bit line BL3a' are coupled to the sense line S1a. The fourth bit line BL3a and the third bit line BL1a' are coupled to the sense line S3a. This is because the sense lines S1a and S3a cross each other in the sense and data multiplexer section 6.

Similarly, the seventh bit line BL3b and the eighth bit line BL1b' are coupled to the sense line S3b. The eighth bit line BL1b and the seventh bit line BL3b' are coupled to the sense line S1b. This is because the sense lines S1b and S3b cross each other in the sense and data multiplexer section 6.

The internal configuration of the memory matrix 5 and the interconnection of the memory matrix 5 with the sense and data multiplexer section 4 are similar to those described, so their illustration and description are omitted. The internal configuration of each of the additional sense and data multiplexer sections disposed adjacent to the right edge of the memory matrix 3 and the adjacent to the left edge of the memory matrix 5, and their connection with the memory matrices 3 and 5 are similar to those described, so their illustration and description are omitted.

An advantage of the novel arrangement in FIG. 1 is that no two adjacent bit lines are coupled to the same sense amplifier. For instance, the first sense amplifier 20 is coupled to the first and sixth bit lines BL0a and BL0b. The second sense amplifier 21 is coupled to the third and eighth bit lines BL1a and BL1b. The third sense amplifier 22 is coupled to the second and fifth bit lines BL2a and BL2b. The fourth sense amplifier 23 is coupled to the fourth and seventh bit lines BL3a and BL3b. There is accordingly no need for adjacent bit lines to be widely spaced to accommodate a sense amplifier between them. Bit lines can be more densely laid out than in the prior art, thus reducing the size of the semiconductor memory.

Another advantage of the novel arrangement is that adequate space between sense amplifiers is provided without requiring extra chip space to be devoted to this purpose. In the vertical direction in FIG. 1, there is only one sense amplifier every eight bit lines, instead of one sense amplifier every four bit lines as in the prior art. Spacing between sense amplifiers thus remains adequate even if the space between adjacent bit lines is greatly reduced.

Figure 2:
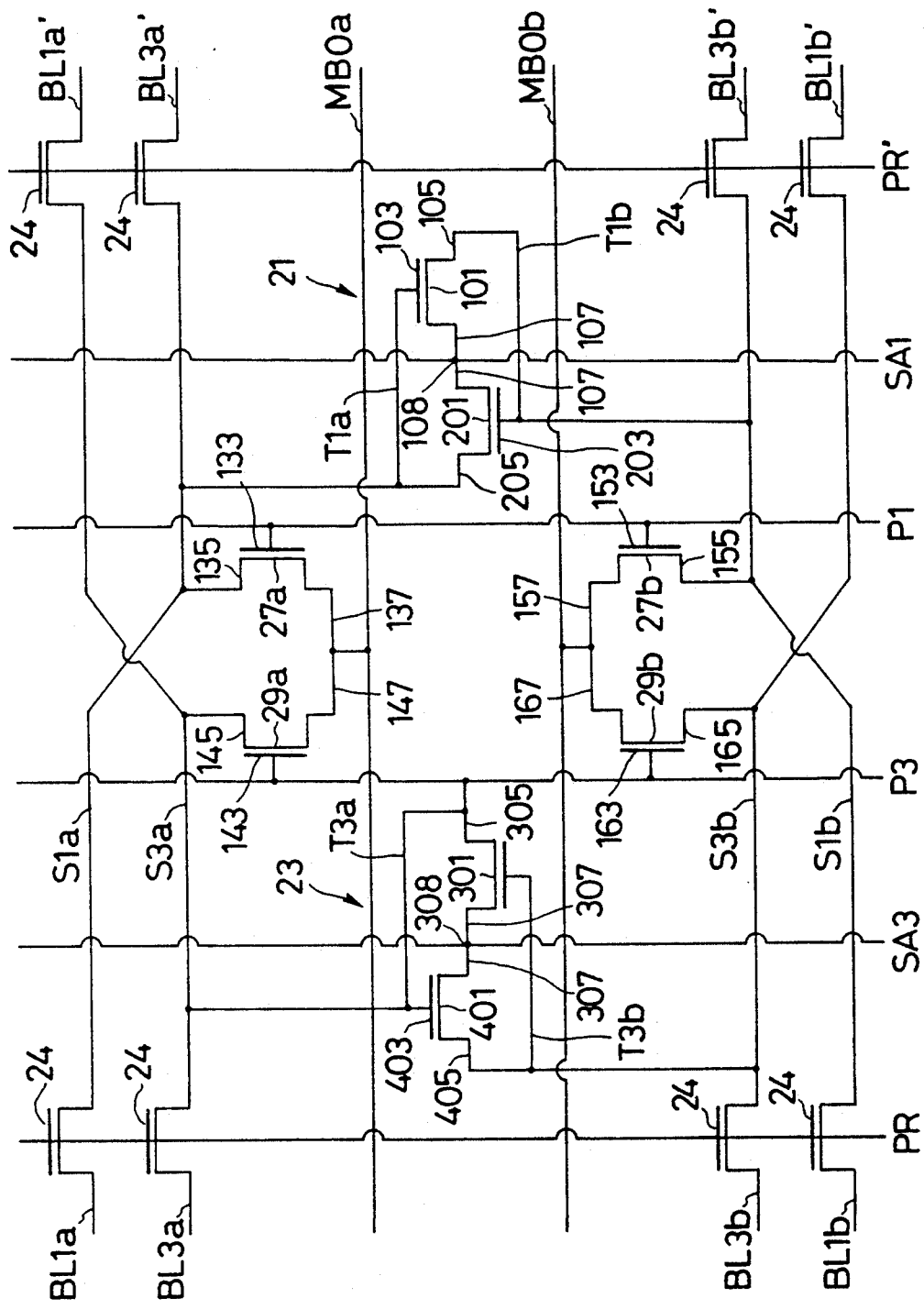
FIG. 2 is a circuit diagram showing details of the sense and data multiplexer section 6.

FIG. 2 shows details of the sense and data multiplexer section 6. As illustrated, the sense amplifier 21 comprises a pair of transistors 101 and 201 which are cross-coupled, i.e., which have their gate electrodes 103 and 203 connected to the drain electrodes 205 and 105 of the other transistors 201 and 101. The drain electrodes 205 and 105 and the gate electrodes 103 and 203 connected thereto form the sense nodes T1a and T1b, and are connected to the sense lines S1a and S1b. Similarly, the sense amplifier 23 comprises a pair of cross-coupled transistors 301 and 401, with their gate electrodes 303 and 403 connected to the drain electrodes 405 and 305 of the other transistors 401 and 301. The drain electrodes 301 and 401 and the gate electrodes 403 and 303 connected thereto form the sense nodes T3a and T3b, and are connected to the sense lines S3a and S3b.

The sense amplifiers 20 and 22 in the sense and data multiplexer section 4 are similarly configured and connected.

As shown in FIG. 1 and 2, the sense lines S1a and S3a cross each other without contacting each other such that at the left part of the sense and data multiplexer section 6 (where the sense amplifier 23 is disposed) the sense line S3a runs closer than the sense line S1a to the sense amplifier 23, whereas in the right part of the sense and data multiplexer section 6 (where the sense amplifier 21 is disposed) the sense line S1a runs closer than the sense line S3a to the sense amplifier 21. Similarly, the sense lines S1b and S3b cross each other such that at the left part of the sense and data multiplexer section 6 (where the sense amplifier 23 is disposed) the sense line S3b runs closer than the sense line S1b to the sense amplifier 23, whereas in the right part of the sense and data multiplexer section 6 (where the sense amplifier 21 is disposed) the sense line S1b runs closer than the sense line S3b to the sense amplifier 21.

Similarly, the sense lines S0a and S2a cross each other such that in the right part of the sense and data multiplexer section 4 (where the sense amplifier 22 is disposed) the sense line S2a runs closer than the sense line S0a to the sense amplifier 22, whereas in the left part of the sense and data multiplexer section 4 (where the sense amplifier 20 is disposed) the sense line S0a runs closer than the sense line S2a to the sense amplifier 20. Similarly, the sense lines S0b and S2b cross each other such that in the right part of the sense and data multiplexer section 4 (where the sense amplifier 22 is disposed) the sense line S2b runs closer than the sense line S0b to the sense amplifier 22, whereas in the left part of the sense and data multiplexer section 4 (where the sense amplifier 20 is disposed) the sense line S0b runs closer than the sense line S2b to the sense amplifier 20.

The above described arrangement of the sense lines with the crossings facilitates connection of the sense lines with the sense amplifiers. More specifically, the numbers of contacts for connection between conductors of different levels or layers is reduced, and the space for the interconnection is reduced.

The sense lines S0a to S3a and S0b to S3b are also coupled via further switching transistors 26a to 29a and 26b to 29b to a pair of data bus lines MB0a and MB0b.

Specifically, the sense lines S0a and S0b are coupled to the data bus lines MB0a and MB0b via a pair of transistors 26a and 26b, the gates of which are connected to a P0 select signal line. The sense lines S1a and S1b are coupled to the data bus lines MB0a and MB0b via a pair of transistors 27a and 27b, the gates of which are connected to a P1 select signal line. The sense lines S2a and S2b are coupled to the data bus lines MB0a and MB0b via a pair of transistors 28a and 28b, the gates of which are connected to a P2 select signal line. The sense lines S3a and S3b are coupled to the data bus lines MB0a and MB0b via a pair of transistors 29a and 29b, the gates of which are connected to a P3 select signal line.

As best illustrated in FIG. 2, the transistors 27a and 29a are disposed side by side in the row direction, and their sources 135 and 145 are connected together to the data bus line MB0a. Similarly, the transistors 27b and 29b are disposed side by side in the row direction, and their sources 155 and 165 are connected together to the data bus line MB0b. The transistors 26a, 28a, 26b and 28b in the sense and data multiplexer section 4 are disposed in the same way as are the transistors 27a, 29a, 27b and 29b. That is, the transistors 26a and 28a are disposed side by side in the row direction, and their sources are connected together to the data bus line MB0a. Similarly, the transistors 26b and 28b are disposed side by side in the row direction, and their sources are connected together to the data bus line MB0b.

When the memory in FIG. 1 is accessed to read data, a row decoder not shown in the drawing selects and activates one of the word lines WL0, WL1, . . . . For example, the word line WL0 is activated, thereby transmitting information in the form of electrical charges stored in the first, third, fifth, and seventh memory cells 8, 10, 12, and 14 (and possibly other memory cells not shown in the drawing) to respective bit lines BL0a, BL1a, BL2b, and BL3b (and possibly other bit lines not shown in the drawing). This results in potential differences between the four bit lines BL0a, BL1a, BL2b, and BL3b and the other four bit lines shown in the drawing. The selected precharge signal lines PR are activated, while other precharge signal lines PR' and PR" are not activated. As a result, all bit lines in the memory matrix 2 are coupled to the sense amplifiers in the sense and data multiplexer sections 4 and 6, while the bit lines in adjacent memory cell matrices 3 and 5 are disconnected from the sense amplifiers in the sense and data multiplexer sections 4 and 6.

The sense amplifier activation lines SA1 and SA3 (FIG. 2) are made active, so that each of the sense amplifiers 20 to 23 amplifies the potential difference between the pair of bit lines to which it is coupled via the sense lines. One of the select signal lines P0, P1, P2, or P3 is now activated. For example, the select signal P0 is activated, switching on the transistors 26a and 26b, thereby coupling the sense line S0a to the data bus line MB0a and the sense line S0b to the data bus line MB0b. The amplified potential difference between these sense lines is now transmitted to the data bus lines MB0a and MB0b. Other pairs of data bus lines not shown in the drawing are driven in a similar manner.

A column decoder not shown in the drawing now selects one of the pairs of data bus lines. For example, the data bus lines MB0a and MB0b are selected, thereby providing the information stored in the first memory cell 8 as output of the semiconductor memory.

Figure 3B:
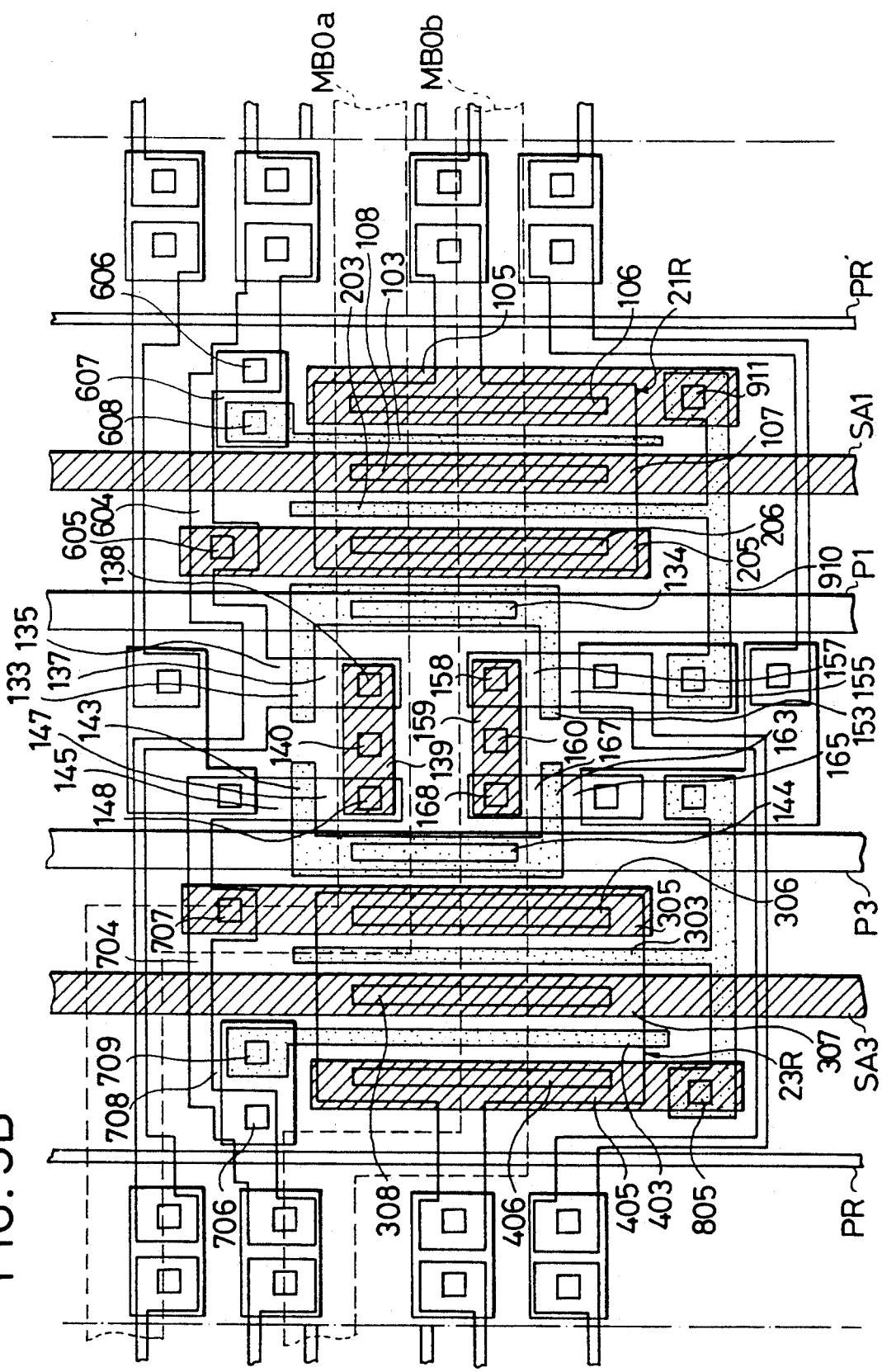
Figure 3C:
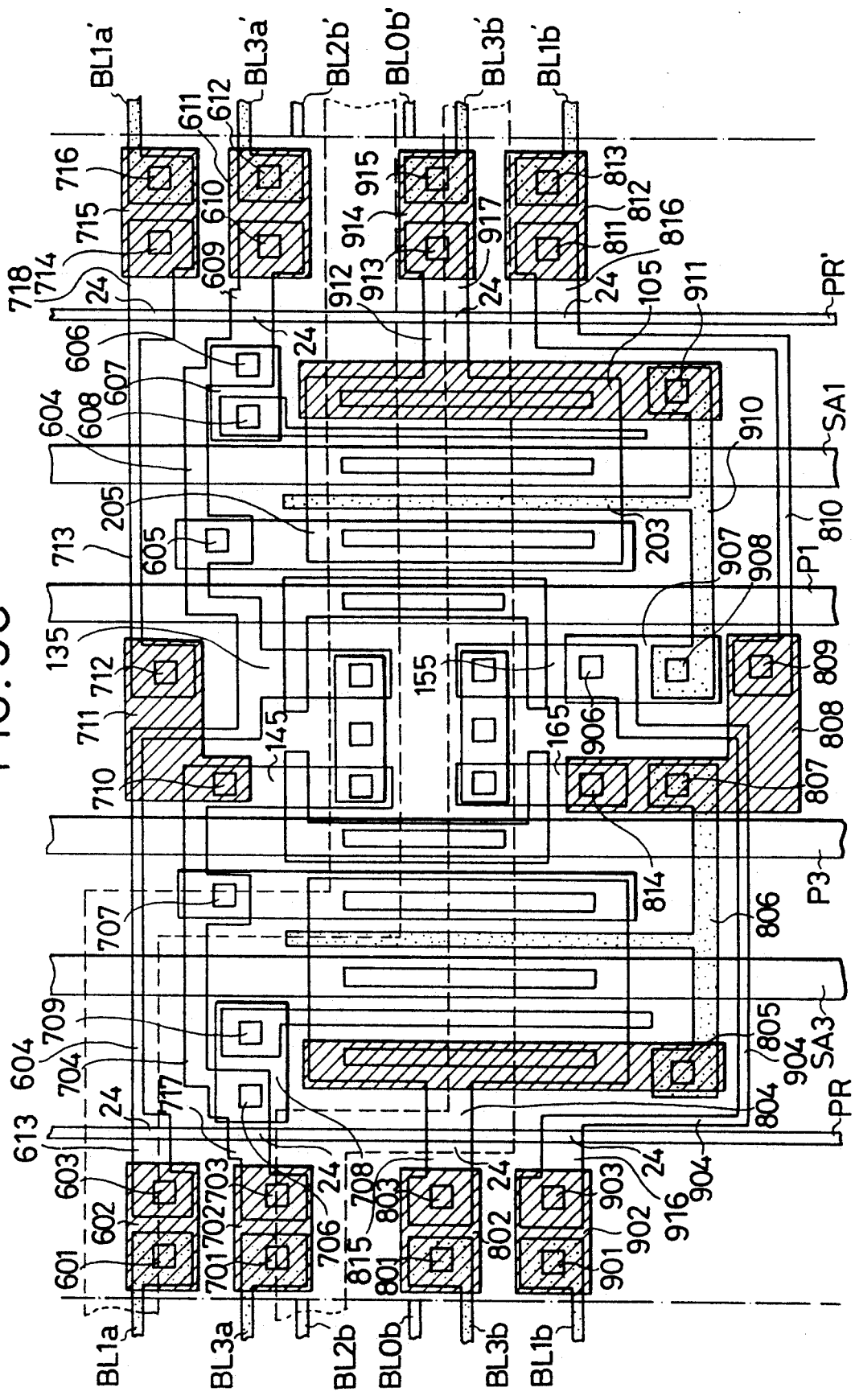

Further features of the invention will be described with reference to FIG. 3A to FIG. 3C, which are all layout diagrams of the part illustrated in FIG. 2, showing the patterns of conductors of various layers, including the active regions (doped, conductive regions in the silicon substrate), first and second polysilicon layers, and first and second metal layers. In FIG. 3A, first metal layers are hatched, while the first and second polysilicon layers are dotted. The only second metal layer are the data bus lines MB0a and MB0b. The bit lines BL1a, BL3a, BL3b, BL1b, BL1a', BL3a', BL3b' and BL1b', the sense amplifiers 21 and 23, the transistors 101, 201, 301 and 401, 27a, 27b, 29a, 29b and 24 are indicated with the same reference numerals as in FIG. 2. FIG. 3B indicates reference numerals for various parts of the transistors and is used for explanation of transistors. Only those parts of the first metal layer and the polysilicon layers which are relevant are hatched or dotted. FIG. 3C indicates reference numerals for various parts of forming the sense lines and is used for explanation of sense lines. Only those parts of the first metal layer and the polysilicon layer which are relevant are hatched or dotted.

Referring in particular to FIG. 3B as well as FIG. 3A, the transistors 101 and 201 forming the sense amplifier 21 are formed in a generally rectangular transistor region 21R. The transistor 101 comprises a gate electrode 103 formed of the first polysilicon layer, extending in the vertical direction and extending beyond the upper edge of the rectangular transistor region 21R. The transistor 101 also comprises a drain electrode 105 formed of the first metal layer and extending parallel to the gate electrode 103, and connected via a contact 106 to the source region (in the silicon substrate). The drain electrode 105 extends beyond the lower edge of the rectangular transistor region 21R. The transistor 201 comprises a gate electrode 203 formed of the first polysilicon layer, extending parallel to the gate electrode 103, and extending beyond the lower edge of the rectangular transistor region 21R. The transistor 201 also comprises a drain electrode 205 formed of the first metal layer and extending parallel with the gate electrode 203, and connected via a contact 206 to the source region.

An active region 107 between the channels under the gate electrodes 103 and 203 forms a common source for the two transistors 101 and 201, and is connected to the sense amplifier activation line SA1, which is formed of the first metal layer and which runs vertically, parallel to the gate electrodes 103 and 203.

The gate electrode 103 and the drain electrode 205 which extend beyond the upper edge of the rectangular region 21R are connected to each other, in a manner later described, and form the sense node T1a, which is connected to the sense line S1a as will be later described. The gate electrode 203 and the drain electrode 105 which extend beyond the lower edge of the rectangular region 21R are connected to each other, in a manner later described, and form the sense node T1b, which is connected to the sense line S1b as will be later described.

The transistors 301 and 401 forming the sense amplifier 23 are formed in a generally rectangular transistor region 23R. The transistor 301 comprises a gate electrode 303 formed of the first polysilicon layer, extending in the vertical direction and extending beyond the lower edge of the rectangular transistor region 23R. The transistor 301 also comprises a drain electrode 305 formed of the first metal layer and extending parallel to the gate electrode 303, and connected via a contact 306 to the source region. The drain electrode 305 extends beyond the upper edge of the rectangular transistor region 23R. The transistor 401 comprises a gate electrode 403 formed of the first polysilicon layer, extending parallel to the gate electrode 303, and extending beyond the upper edge of the rectangular transistor region 23R. The transistor 401 also comprises a drain electrode 405 formed of the first metal layer and extending parallel with the gate electrode 403, and connected via a contact 406 to the source region.

An active region 307 between the channels under the gate electrodes 303 and 403 forms a common source for the two transistors 301 and 401, and is connected to the sense amplifier activation line SA3, which is formed of the first metal layer and which runs vertically parallel to the gate electrodes 303 and 403.

The gate electrode 303 and the drain electrode 405 which extend beyond the lower edge of the rectangular region 21R are connected to each other, in a manner later described, and form the sense node T3b, which is connected to the sense line S3b as will be later described. The gate electrode 403 and the drain electrode 405 which extend beyond the upper edge of the rectangular region 23R are connected to each other, in a manner later described, and form the sense node T3a, which is connected to the sense line S3a as will be later described.

The rectangular transistor regions 21R and 23R of the sense amplifiers 21 and 23 are disposed side by side in the row direction, and their upper edges are substantially in alignment with each other, and their lower edges are substantially in alignment with each other.

The transistors 27a, 27b, 29a and 29b are disposed in a space between the sense amplifiers 21 and 23. The transistors 27a and 29a are disposed side by side in the row direction, with their sources adjacent to each other. Similarly, the transistors 27b and 29b are disposed side by side in the row direction, with their sources adjacent to each other. The transistors 27a and 27b are aligned in the vertical direction. The transistors 29a and 29b are aligned in the vertical direction.

The transistors 27a and 27b have gate electrodes 133 and 153 which are formed of the first polysilicon layer, and which are continuous with each other, and connected via a contact 134 to the select signal line P1 which is formed of the first metal layer and which extends vertically.

The transistors 29a and 29b have gate electrodes 143 and 163 which are formed of the first polysilicon layer, and which are continuous with each other, and connected via a contact 144 to the select signal line P3 which is formed of the first metal layer and which extends vertically.

Sources 137 and 147 of the transistors 27a and 29a are connected via contacts 138 and 148 to a metal conductor 139, which in turn is connected via a through-hole (contact between metal layers) 140 to the data bus line MB0a which is formed of the second metal layer and which extends generally horizontally. Sources 157 and 167 of the transistors 27b and 29b are connected via contacts 158 and 158 to a metal conductor 159, which in turn is connected via a through-hole 160 to the data bus line MB0b which is formed of the second metal layer and which extends generally horizontally.

Drains 135, 145, 155 and 165 of the transistors 27a, 29a, 27b and 29b are connected to the respective sense lines S1a, S3a, S1b and S3b, as will be described later.

Since the transistors 27a and 29a which connect or disconnect the sense amplifiers 21 and 23 to or from the data bus line MB0a are disposed between the sense amplifiers 21 and 23 side by side, with their sources 137 and 147 adjacent to each other, the sources 137 and 147 can be connected commonly via the short metal conductor 139 to the data bus line MB0a. Similarly, since the transistors 27b and 29b which connect or disconnect the sense amplifiers 21 and 23 to or from the data bus line MB0b are disposed between the sense amplifiers 21 and 23 side by side, with their sources 157 and 167 adjacent to each other, the sources 157 and 167 can be connected commonly via the short metal conductor 159 to the data bus line MB0b. Moreover, the transistors 27a and 27b, and the sense amplifier 21, on one hand, and the transistors 29a, 29b and the sense amplifier 23 on the other hand are substantially symmetrically disposed with respect to a line connecting the centers of the through-holes 140 and 160. Accordingly, difference in the impedance (particularly, the resistance and the capacitance) over the conductors from the sense amplifiers to the data bus lines is minimized. Moreover, the length of the path for the signal from each of the sense amplifiers to each data bus line is minimized. The reliability of operation is increased, the operation speed is heightened, and the space for the interconnection is reduced.

Since the sense amplifiers are disposed side by side, the height of each sense amplifier may be as large as the width of eight rows. Conversely speaking, the pitch of the bit lines may be reduced to one-eighth of the height of one sense amplifier.

Referring now to FIG. 3C as well as to FIG. 3A, the bit lines BL1a, BL3a, BL3b and BL1b which are formed of a second polysilicon layer, are connected via contacts 601, 701, 801 and 901, to metal conductors 601, 702, 802 and 902, and then via another contacts 603, 703, 803 and 903, to active regions 613, 717, 815 and 916, which in turn are connected via the transistor switches 24, whose gate electrodes are formed of the precharge signal line PR, to active regions 604, 704, 804 and 904.

The second active region 704 extends, running adjacent the upper edge of the rectangular transistor region 23R, up to the vicinity of the transistor 29a, where it is connected via a contact 710 to a metal conductor 711. The conductor 711 is connected via another contact 712 to another active region 713. The right end of the active region 713 is connected via the transistor switch 24, whose gate electrode is formed of the precharge signal line PR', to a further active region 718. The active region 718 is connected via a contact 714 to a metal conductor 715, which in turn is connected via a contact 716 to the bit line BL1a' in the memory matrix 3.

The active regions 704, 713, 717 and 718, and the metal conductor 711 together form the sense line S3a.

The gate electrode 403 is connected via a contact 709, a metal conductor 708 and a contact 706 to the active region 704 forming part of the sense line S3a. The drain electrode 305 is connected via a contact 707 to the active region 704 forming part of the sense line S3a. Thus, the gate electrode 403 and the drain electrodes 305 are connected to each other via the contact 709, the metal conductor 708, the contact 706, the active region 704 and the contact 707.

The drain 145 of the transistor 29a is continuous with and is hence connected to the active region 704 forming part of the sense line S3a.

The active region 804 is continuous with the drain of the transistor 401 and connected to the drain electrode 405, and connected via a contact 805 to a polysilicon conductor 806 which extends, running adjacent the lower edge of the rectangular transistor region 23R, up to the vicinity of the transistor 29b, where it is connected via a contact 807 to a metal conductor 808. The conductor 808 is connected via a contact 809 to an active region 810, which extends horizontally beyond the right end of the sense amplifier 21 and then bent to extend upward, and then again bent to extend rightward. The right end of the active region 810 is connected via the transistor switch 24, whose gate electrode is formed of the precharge signal line PR', to a further active region 816. The active region 816 is connected via a contact 811 to a metal conductor 812, which in turn is connected via a contact 813 to the bit line BL1b' in the memory matrix 3.

The active regions 804, 810, 815 and 816, the polysilicon conductor 806, the metal conductor 808, and the drain electrode 405 and the drain of the transistor 401 together form the sense line S3b.

The drain electrode 405 forms part of the sense line S3b. The gate electrode 303 formed of the polysilicon layer is continuous with and is thus connected to the polysilicon conductor 806 forming part of the sense line S3b. The gate electrode 303 and the drain electrodes 405 are connected to each other via the polysilicon conductor 806 and the contact 805.

The drain 165 of the transistor 29b is connected via a contact 814 to the metal conductor 808 forming part of the sense line S3b.

The active region 604 extends to the right up to the vicinity of the contact 712 and is bent to extend downward and is then bent to extend rightward, running adjacent the upper edge of the rectangular transistor region 21R. The right end of the active region 604 is connected via the transistor switch 24, whose gate electrode is formed of the precharge signal line PR', to a further active region 609. The active region 609 is connected via a contact 610 to a metal conductor 611, which in turn is connected via a contact 612 to the bit line BL3a' in the memory matrix 3.

The active regions 604, 609 and 613 together form the sense line S1a.

The drain electrode 205 is connected via a contact 605 to the active region 604 forming part of the sense line S1a. The gate electrode 103 is connected via a contact 608, a metal conductor 607 and a contact 606 to the active region 604 forming part of the sense line S1a. The gate electrode 103 and the drain electrode 205 are connected to each other via the contact 608, the metal conductor 607, the contact 606, the active region 604 and the contact 605.

The drain 135 of the transistor 27a is continuous with and is hence connected to the active region 604 forming part of the sense line S1a.

The active region 904 extends first downward to circumvent the sense amplifier 23, and then rightward up to the vicinity of the contact 809 and is bent to extend upward and connected via a contact 906 to a metal conductor 907, which is connected via a contact 908 to a polysilicon conductor 910, which extends, running along the lower edge of the rectangular transistor region 21R to a location adjacent the lower end of the drain of the transistor 101, where it is connected via a contact 911 to the drain electrode 105. Another active region 912 continuous with the drain of the transistor 101 extends rightward. The right end of the active region 912 is connected via the transistor switch 24, whose gate electrode is formed of the precharge signal line PR', to further active region 917. The active region 917 is connected via a contact 913 to a metal conductor 914, which in turn is connected via a contact 915 to the bit line BL3b'.

The active regions 904, 912, 916 and 917, the metal conductor 907, the polysilicon conductor 910, and the drain electrode 105 and the drain of the transistor 101 together form the sense line S1b.

The drain electrode 105 forms part of the sense line S1b. The gate electrode 203 is continuous with and is hence connected to the polysilicon conductor 910 forming part of the sense line S1b. The gate electrode 203 and the drain electrodes 105 are connected to each other via the polysilicon conductor 910 and the contact 911.

The drain 155 of the transistor 27b is continuous with and is hence connected to the active region 904 forming part of the sense line S1b.

The sense lines S1a and S3a cross each other at the metal conductor 711 and the active region 604 disposed below the metal conductor 711. The crossing is at a location intermediate in the row direction between the two sense amplifiers 21 and 23, more specifically between the nodes where the sense amplifiers 21 and 23 are connected to the sense lines S1a and S3a. In the part to the left of the crossing, the sense line S3a is closer than the sense line S1a to the sense amplifier 23, and is connected to the drain electrode 305 and the gate electrode 403 of the respective transistors 301 and 401 forming the sense amplifier 23. In the part to the right of the crossing, the sense line S1a is closer than the sense line S3a to the sense amplifier 21, and is connected to the drain electrode 205 and the gate electrode 103 of the respective transistors 201 and 101 forming the sense amplifier 21.

The sense lines S1b and S3b cross each other at the metal conductor 808 and the active region 904 disposed below the metal conductor 808. The crossing is at a location intermediate in the row direction between the two sense amplifier 21 and 23, more specifically between the nodes where the sense amplifiers 21 and 23 are connected to the sense lines S1b and S3b. In the part to the left of the crossing, the sense line S3b is closer than the sense line S1b to the sense amplifier 23, and is connected to the drain electrode 405 and the gate electrode 303 of the respective transistors 401 and 301 forming the sense amplifier 23. In the part to the right of the crossing, the sense line S1b is closer than the sense line S3b to the sense amplifier 21, and is connected to the drain electrode 105 and the gate electrode 203 of the respective transistors 101 and 201 forming the sense amplifier 21.

Because of the crossings, the connection of the sense lines to the sense amplifiers is facilitated, and the number of the contacts near the sense amplifiers is reduced, and the space for the contacts and interconnection is reduced.

The invention is not limited to the circuit arrangement shown in the drawing. For example, the semiconductor memory need not be a dynamic random access memory. The invention is also applicable to other types of semiconductor memory, such as static random access memory.

It was assumed that the memory is formed of silicon. But is can be formed other semiconductors. The metal conductor layer may for example be formed of aluminum, but may be formed other kinds of metal or alloys. In place of the polysilicon layers, other conductor layers can be used.

What is claimed is:

1. A semiconductor memory comprising:
    a memory matrix having a plurality of parallel bit lines, comprising a first bit line, a second bit line adjacent to said first bit line, a third bit line adjacent to said second bit line, a fourth bit line adjacent to said third bit line, a fifth bit line adjacent to said fourth bit line, a sixth bit line adjacent to said fifth bit line, a seventh bit line adjacent to said sixth bit line, and an eighth bit line adjacent to said seventh bit line, with the first to eighth bit lines arranged in order of their numbers;
    a first sense amplifier coupled to said first bit line and said sixth bit line, for amplifying a potential difference therebetween;
    a second sense amplifier coupled to said third bit line and said eighth bit line, for amplifying a potential difference therebetween;
    a third sense amplifier coupled to said second bit line and said fifth bit line, for amplifying a potential difference therebetween; and
    a fourth sense amplifier coupled to said fourth bit line and said seventh bit line, for amplifying a potential difference therebetween.

2. The memory of claim 1, wherein said memory matrix also has
    a plurality of parallel word lines orthogonally intersecting said bit lines; and
    a plurality of memory cells disposed at alternate intersections of said word lines and said bit lines, so that when a word line intersects two adjacent bit lines a memory cell is connected to that word line and just one of the two adjacent bit lines.

3. The memory of claim 1, wherein said first sense amplifier and said third sense amplifier are disposed in a first sense amplifier section disposed on one side of said memory matrix, and said second sense amplifier and said fourth sense amplifier are disposed in a second sense amplifier section disposed on another side of said memory matrix.

4. The memory of claim 3, further comprising an additional memory matrix disposed such that said second sense amplifier section is interposed between said additional memory matrix and the first-mentioned memory matrix, said additional memory matrix having a plurality of parallel bit lines, comprising a first bit line, a second bit line adjacent to said first bit line, a third bit line adjacent to said second bit line, a fourth bit line adjacent to said third bit line, a fifth bit line adjacent to said fourth bit line, a sixth bit line adjacent to said fifth bit line, a seventh bit line adjacent to said sixth bit line, and an eighth bit line adjacent to said seventh bit line, with the first to eighth bit lines arranged in order of their numbers;
    wherein the third and eight bit lines in said additional memory matrix are coupled to said fourth sense amplifier; and
    the fourth and seventh bit lines in said additional memory matrix are coupled to said second sense amplifier.

5. The memory of claim 4, wherein said additional memory matrix also has a plurality of parallel word lines orthogonally intersecting said bit lines; and
    a plurality of memory cells disposed at alternate intersections of said word lines and said bit lines, so that when a word line intersects two adjacent bit lines a memory cell is connected to that word line and just one of the two adjacent bit lines.

6. The memory of claim 4, wherein
    said second sense amplifier and said fourth sense amplifier are disposed side by side in a direction parallel to said bit lines;
    said third, fourth, seventh and eighth bit lines in the first-mentioned memory matrix and said third, fourth, seventh and eighth bit lines in said additional memory matrix are coupled to said second and fourth sense amplifiers via first to fourth sense lines;
    the first sense line coupled to said third bit line in the first-mentioned memory matrix and to said fourth bit line in said additional memory matrix, and the second sense line coupled to said fourth bit line in the first-mentioned memory matrix and to said third bit line in said additional memory matrix cross each other at a location intermediate between the first and second sense amplifiers in the direction parallel to the bit lines;

the third sense line coupled to said eighth bit line in the first-mentioned memory matrix and to said seventh bit line in said additional memory matrix, and the fourth sense line coupled to said seventh bit line in the first-mentioned memory matrix and the eighth bit line in said additional memory matrix cross each other at a location intermediate between the first and second sense amplifiers in the direction parallel to the bit lines.

7. The memory of claim 3, wherein:

said first sense amplifier and said third sense amplifier are disposed side by side in the direction parallel to said bit lines; and said second sense amplifier and said fourth sense amplifier are disposed side by side in a direction parallel to said bit lines.

8. The memory of claim 1, also comprising a pair of data bus lines, each of which is coupled to said first sense amplifier, said second sense amplifier, said third sense amplifier, and said fourth sense amplifier.

9. The memory of claim 8, further comprising switching transistors provided in pairs in the sense amplifier sections, a first switching transistor in one of the pairs connecting one of the sense amplifiers in the sense amplifier section to one of the data bus lines, and a second switching transistor in said one of the pairs connecting the other sense amplifier in the same sense amplifier section to said one of the data bus line, wherein said first and second switching transistors in said one of the pairs are disposed side by side in the direction parallel to said bit lines and have their first main electrodes commonly connected to said one of the data bus lines.

10. The memory of claim 1, comprising additional bit lines and sense amplifiers divided into groups of eight adjacent bit lines and four sense amplifiers each, the bit lines and sense amplifiers in each of said groups being numbered and coupled as in claim 1.

11. The memory of claim 10, comprising one pair of data bus lines for each of said groups.

12. A semiconductor memory comprising:

a sense amplifier section;

a first memory matrix disposed on one side of said sense amplifier section having a plurality of parallel bit lines, comprising a first bit line, a second bit line adjacent to said first bit line, a third bit line adjacent to said second bit line, a fourth bit line adjacent to said third bit line, a fifth bit line adjacent to said fourth bit line, a sixth bit line adjacent to said fifth bit line, a seventh bit line adjacent to said sixth bit line, and an eighth bit line adjacent to said seventh bit line, with the first to eighth bit lines arranged in order of their numbers; and a second memory matrix disposed on the other side of said sense amplifier section such that the first and the second memory matrices are on opposite sides of the sense amplifier section, said second memory matrix having a plurality of parallel bit lines parallel to the bit lines in said first memory matrix, said parallel bit lines comprising a first bit line, a second bit line adjacent to said first bit line, a third bit line adjacent to said second bit line, a fourth bit line adjacent to said third bit line, a fifth bit line adjacent to said fourth bit line, a sixth bit line adjacent to said fifth bit line, a seventh bit line adjacent to said sixth bit line, and an eighth bit line adjacent to said seventh bit line, with the first to eighth bit lines being arranged in order of their numbers;

said sense amplifier section comprising a first sense amplifier and a second sense amplifier;

said first sense amplifier is coupled to said third bit line and said eighth bit line in said first memory matrix, for amplifying a potential difference therebetween, and also coupled to said fourth bit line and said seventh bit line in said second memory matrix, for amplifying a potential difference therebetween; and said second sense amplifier is coupled to said fourth bit line and said seventh bit line in said first memory matrix, for amplifying a potential difference therebetween, and is coupled to said third bit line and said eighth bit line in said second memory matrix, for amplifying a potential difference therebetween.

13. The memory of claim 12, wherein said first memory matrix also has a plurality of parallel word lines orthogonally intersecting said bit lines; and a plurality of memory cells disposed at alternate intersections of said word lines and said bit lines, so that when a word line intersects two adjacent bit lines a memory cell is connected to that word line and just one of the two adjacent bit lines;

said second memory matrix also has a plurality of parallel word lines orthogonally intersecting said bit lines; and a plurality of memory cells disposed at alternate intersections of said word lines and said bit lines, so that when a word line intersects two adjacent bit lines a memory cell is connected to that word line and just one of the two adjacent bit lines.

14. The memory of claim 12, wherein:

said first sense amplifier and said second sense amplifier are disposed side by side in a direction parallel to said bit lines.

15. The memory of claim 12, also comprising a pair of data bus lines, each of which is coupled to said first sense amplifier and said second sense amplifier.

16. The memory of claim 15, further comprising switching transistors provided in pairs in the sense amplifier section, a first switching transistor in one of the pairs connecting the first sense amplifier to one of the data bus lines, and a second switching transistor in said one of the pairs connecting the second sense amplifier to said one of the data bus line, wherein said first and second switching transistors in said one of the pairs are disposed side by side in the direction of parallel to said bit lines and have their first main electrodes commonly connected to said one of the data bus lines.

17. The memory of claim 12, comprising additional bit lines and sense amplifiers divided into groups of eight adjacent bit lines in each of said first and second memory matrices and two sense amplifiers in said sense amplifier section, the bit lines and sense amplifiers in each of said groups being numbered and coupled as in claim 12.

18. The memory of claim 17, comprising one pair of data bus lines for each of said groups.

19. The memory of claim 12, wherein said first sense amplifier and said second sense amplifier are disposed side by side in a direction parallel to said bit lines;

said third, fourth, seventh and eighth bit lines in the first memory matrix and said third, fourth, seventh and eighth bit lines in said second memory matrix are coupled to said first and second sense amplifiers via first to fourth sense lines;

the first sense line coupled to said third bit line in the first memory matrix and to said fourth bit line in said second memory matrix, and the second sense line coupled to said fourth bit line in the first memory matrix and to said third bit line in said second memory matrix cross each other at a location intermediate between the first and second sense amplifiers in the direction of the bit lines; and the third sense line coupled to said eighth bit line in the first memory matrix and to said seventh bit line in said second memory matrix, and the fourth sense line coupled to said seventh bit line in the first memory matrix and the eighth bit line in said second memory matrix cross each other at a location intermediate between the first and second sense amplifiers in the direction of the bit lines.

* * * * *